United States Patent [19]
Matsumoto

[11] Patent Number: 5,870,333
[45] Date of Patent: Feb. 9, 1999

[54] READ VOLTAGE CONTROL DEVICE FOR SEMICONDUCTOR MEMORY DEVICE

[75] Inventor: Hiroyuki Matsumoto, Tokyo, Japan

[73] Assignee: Mitsubishi Denki Kabushiki Kaisha, Tokyo, Japan

[21] Appl. No.: 886,132

[22] Filed: Jun. 30, 1997

[30] Foreign Application Priority Data

Feb. 6, 1997 [JP] Japan .................................. 9-024078

[51] Int. Cl.[6] .................................................. G11C 16/06
[52] U.S. Cl. .............................. 365/185.2; 365/185.18; 365/191; 365/201
[58] Field of Search ........................... 365/185.2, 185.18, 365/185.22, 201, 189.09, 191, 185.05

[56] References Cited

U.S. PATENT DOCUMENTS

| 5,179,535 | 1/1993 | Nakayama | 365/189.09 |
|---|---|---|---|
| 5,243,576 | 9/1993 | Ishikawa | 365/222 |
| 5,337,282 | 8/1994 | Koike | 365/222 |
| 5,351,211 | 9/1994 | Higeta et al. | 365/189.05 |
| 5,495,452 | 2/1996 | Cha | 365/222 |
| 5,748,530 | 5/1998 | Gotou et al. | 365/185.18 |

FOREIGN PATENT DOCUMENTS

| 5198187 | 8/1993 | Japan . |
|---|---|---|
| 6177359 | 6/1994 | Japan . |

*Primary Examiner*—David Nelms
*Assistant Examiner*—Tuan T. Nguyen
*Attorney, Agent, or Firm*—Leydig, Voit & Mayer

[57] ABSTRACT

A write pulse generating unit for generating write pulses having variable wavelengths is provided. A write pulse having a variable wavelength, generated from the write pulse generating unit, is supplied to a specified transistor memory. Thus, when write pulses, each having a shorter wavelength are supplied to a plurality of transistor memories, variations in read voltage among the transistor memories can be reduced. The write pulse generating unit facilitates identifying transistor memories having degraded retention characteristics upon execution of an accelerated test during baking or burn-in, thereby improving the quality of the memories.

18 Claims, 13 Drawing Sheets

READ VOLTAGE CONTROL DEVICE FOR SEMICONDUCTOR MEMORY DEVICE

BACKGROUND OF THE INVENTION

1. Field of the Invention

The present invention relates to a read voltage control device for a semiconductor memory device such as a reloadable flash EEPROM or the like.

2. Description of the Prior Art

FIG. 14 is a block diagram showing a conventional read voltage control device for a semiconductor memory device. In the drawing, reference numeral 1 indicates an address bus, reference numeral 2 indicates a data bus, reference numerals 3 and 4 respectively indicate an X decoder and a Y decoder electrically connected to the address bus 1, reference numerals 5 respectively indicate word lines electrically connected to the X decoder 3, reference numerals 6 respectively indicate bit lines electrically connected to the Y decoder 4, and reference numeral 7 indicates a transistor memory (cell) electrically connected to the bit line 6 and the word line 5. A memory cell array comprises a plurality of transistors 7 electrically connected to the lines 5 and 6.

Reference numeral 8 indicates a write pulse generator for generating a write pulse therefrom, which comprises a ring oscillator 9 and a frequency divider 10. Reference numeral 11 indicates a tristate buffer electrically connected to the data bus 2, for blocking the writing of data to a write data latch 12 in response to a write enable signal. Reference numeral 12 indicates the write data latch electrically connected to the tristate buffer 11. Reference numeral 13 indicates a write buffer which comprises transistors 15 and 16 as shown in FIG. 2 and supplies a voltage pulse corresponding to the width of a pulse generated from the write pulse generator 8 from a power supply 14 to the corresponding transistor memory 7 via the Y decoder 4 and the corresponding bit line 6 in response to data outputted from the write data latch 12.

Reference numeral 17 indicates a sense amplifier for reading written data when a read voltage for the corresponding transistor memory 7 rises to a threshold $V_{TH}$ exceeding a predetermined value. Reference numeral 18 indicates a read data latch electrically connected to the sense amplifier 17. Reference numeral 19 indicates a tristate buffer for blocking the supply of data latched into the read data latch 18 to the data bus 2 in response to a read enable signal. Reference numeral 20 indicates a tester for supplying a new address signal to the X decoder 3 and the Y decoder 4 and supplying a new data signal to the tristate buffer 11 when the tester determines that the data stored in the corresponding transistor memory 7 can be read by the tristate buffer 19 through the data bus 2.

The operation of the read voltage control device will next be explained.

FIG. 14 shows a configuration of a reloadable flash EEPROM. A test to write data into a manufactured flash EEPROM is performed by electrically connecting the tester 20 to the address bus 1 and the data bus 2.

FIG. 15 is a flowchart for explaining the operation of the conventional read voltage control device for a semiconductor memory device. The tester 20 first defines the address as a leading address (Step ST1) and initializes a loop counter X (Step ST2). Next, the tester 20 proceeds to the setting of a program mode (Step ST3) and sets program data and an address (Step ST4).

An address signal outputted from the tester 20 through the address bus I according to the address set in this way, is decoded by the X decoder 3 and the Y decoder 4 so that a given transistor memory 7 of the memory cell array is specified. A data signal outputted from the tester 20 through the data bus 2 in response to the program data set as described above is outputted to the write buffer 13 through the tristate buffer 11 and the write data latch 12. Further, the write buffer 13 supplies a voltage pulse corresponding to the width of the pulse generated from the write pulse generator 8 from the power supply 14 to the above-specified transistor memory 7 through the Y decoder 4 and the corresponding bit line 6. The supply of the voltage to the transistor memory 7 at one time is performed for 10 µs (Step ST5).

Further, the tester 20 increments the loop counter X by 1 (Step ST6) and proceeds to the setting of a program verify mode (Step ST7). The program verify mode is used to read written data when the read voltage for the transistor memory 7 specified by the sense amplifier 17 has risen to the threshold $V_{TH}$ exceeding the predetermined value and allowing the tester 20 to recognize the satisfactory writing of the specified transistor memory 7 through the read data latch 18, tristate buffer 19 and data bus 2. This program verify mode is executed upon verification (Step ST12). Upon the writing of the data to the transistor memory 7, the supply of the voltage pulse to the transistor memory 7 at one time causes no attainment of the read voltage to the threshold $V_{TH}$ allowing the reading of the written data and hence the voltage pulse is always supplied plural times. Accordingly, the number of times that the voltage pulse is supplied, is set to 25 times as an upper limit (Step ST9). If the number of times that the voltage pulse is supplied, reaches 25 times and the read voltage fails to reach the threshold $V_{TH}$ where written data can be read (Step ST10), then the tester 20 sets a read mode and determines the product as a failed component (FAIL) (Step ST11).

If it is determined in Step ST10 that the read voltage has reached the threshold $V_{TH}$ where written data can be read, then the writing of the data to the transistor memory 7 is determined as satisfactory. If the final address is not reached (Step ST13), then the tester 20 proceeds to the next address (Step ST14). If the answer is found to be NO in Step ST9, then the operations of Steps ST3 to ST12 are repeated until the read voltage reaches the threshold $V_{TH}$ where written data can be read (Step ST12). Namely, the voltage pulse is supplied to the transistor memory 7 plural times. If the processing on the final address is completed by the repetition of these operations, then the tester 20 sets the read mode and determines the product as a good article (PASS) (Step ST15).

Since the conventional read voltage control device for a semiconductor memory device is constructed as described above, only one type is used as the type of the width of the pulse generated from the write pulse generator 8. Thus, the voltage pulse supplied from the write buffer 13 to the transistor memory 7 has a constant pulse width at all times.

Therefore, the read voltage from the transistor memory 7 rises stepwise as shown in FIG. 16 each time the voltage pulse is supplied from the write buffer 13 to the transistor memory 7. Further, the supply of the voltage pulse from write buffer 13 to the transistor memory 7 is stopped when the read voltage has reached the threshold $V_{TH}$ at which the sense amplifier 17 can read the written data. However, since the width of the voltage pulse supplied from the write buffer 13 cannot be selected, the width V of the stepwise voltage increases, thus causing a problem that variations in read voltages from the plurality of transistor memories 7 occur.

Further, since the width of the voltage pulse supplied from the write buffer 13 cannot be selected, the number of times that the voltage pulse is supplied to each transistor memory 7 whose read voltage is hard to reach the threshold $V_{TH}$ exceeding the predetermined value even if the voltage pulse is supplied thereto, increases, thereby causing a problem that time is required to execute a series of tests.

Moreover, there may be cases in which the voltage pulse is simultaneously supplied to the plurality of transistor memories 7. In this case, the difference in the rise of the read voltage occurs between the plurality of transistor memories 7a and 7b due to variations in manufacture as shown in FIG. 17 by way of example. Thus, the voltage pulse is continuously supplied to the transistor memory 7a until the read voltage reaches the threshold $V_{TH}$ allowing the reading of the data written into the transistor memory 7b. Accordingly, a problem arises in that the difference V in the read voltage is developed between the transistor memories 7a and 7b and an increase in the difference V in the read voltage results in malfunction and makes it hard to execute the subsequent tests.

SUMMARY OF THE INVENTION

With the foregoing points in view, it is therefore an object of the present invention to provide a read voltage control device suitable for use in a semiconductor memory device, which is capable of selecting the width of a voltage pulse supplied to each of cells, reducing variations in read voltages among the cells and shortening a decision time.

According to a first construction of the present invention, for achieving the above object, there is provided a read voltage control device for a semiconductor memory device, which includes a write pulse generating unit for generating a write pulse having an arbitrary wavelength and supplies the write pulse having the wavelength, which has been generated from the write pulse generating unit, to a specified cell. Thus, an advantageous effect can be obtained in that when write pulses each having a wavelength shorter than ever are supplied to a plurality of cells, it is possible to reduce variations in read voltages among the plurality of cells and it is easy to find the cells degraded in retention characteristic upon execution of an acceleration test at baking or burn-in, whereby the quality thereof can be improved. Another advantageous effect can be brought about in that if a write pulse having a wavelength slightly longer than ever is supplied to a corresponding cell, then the number of times that data writing is performed, can be reduced and the decision time can be shortened. A further advantageous effect can be obtained in that if one of a plurality of pulse wavelengths is set identical to a conventionally-used one, then they can be used in the same manner as ever.

According to a second construction of the present invention, there is provided a read voltage control device for a semiconductor memory device, comprising a write pulse generating unit for generating write pulses each having an arbitrary wavelength, a plurality of write pulse supplying units for supplying the write pulses having the wavelengths, which have been generated from the write pulse generating unit, to a plurality of specified cells, and a plurality of read voltage determining units for stopping the supply of a write pulse from a corresponding write pulse supplying unit of the plurality of write pulse supplying units when the data written into the corresponding cell is determined to be capable of reading. Thus, an advantageous effect can be obtained in that when write pulses each having a wavelength shorter than ever are supplied to a plurality of cells, it is possible to reduce variations in read voltages among the plurality of cells and it is easy to find the cells degraded in retention characteristic upon execution of an acceleration test at baking or burn-in, whereby the quality thereof can be improved. Another advantageous effect can be brought about in that if a write pulse having a wavelength slightly longer than ever is supplied to a corresponding cell, then the number of times that data writing is performed, can be reduced and the decision time can be shortened. A further advantageous effect can be obtained in that if one of a plurality of pulse wavelengths is set identical to a conventionally-used one, then they can be used in the same manner as ever. A still further advantageous effect is brought about in that if the written data can be read, the supply of the write pulse is stopped in order from cells whose written data have been brought into a readable state, whereby the difference between read voltages due to variations in manufacture can be reduced.

According to a third construction of the present invention, there is provided a read voltage control device for a semiconductor memory device, which includes a plurality of decision initializing circuits for initializing the results of determination by all of read voltage determining units after the data supplying unit has recognized that all of the read voltage determining units have determined the written data as readable. Thus, an advantageous effect can be obtained in that it is possible to prevent time losses produced upon writing of each cell associated with a new address.

According to a fourth construction of the present invention, there is provided a read voltage control device for a semiconductor memory device, wherein a write pulse generating unit includes a frequency divider for dividing a pulse generated from a pulse generator into a plurality of wavelengths, and a first selecting unit for selecting one of the plurality of wavelengths according to data produced from a data supplying unit. Thus, an advantageous effect can be obtained in that write pulses having arbitrary long and short wavelengths can be supplied to cells respectively according to the data produced from the data supplying unit.

According to a fifth construction of the present invention, there is provided a read voltage control device for a semiconductor memory device, wherein a write pulse generating unit includes a frequency divider for dividing a pulse generated from a pulse generator into a plurality of wavelengths, and a second selecting unit for selecting one of the plurality of wavelengths according to data inputted through first external terminals. Thus, an advantageous effect can be obtained in that write pulses having arbitrary long and short wavelengths can be supplied to cells respectively according to the external data.

According to a sixth construction of the present invention, there is provided a read voltage control device for a semiconductor memory device, wherein a first or a second selecting unit has a second external terminal electrically connected to a variable pulse generating unit for generating a wavelength-variable pulse. Thus, an advantageous effect can be obtained in that the electrical connection of the variable pulse generating unit to the second external terminal permits continuous arbitrary adjustments to wavelengths supplied to cells, a reduction in variations in read voltages among the cells and a decrease in the number of times that data writing is performed.

Typical ones of various inventions of the present application have been shown in brief. However, the various inventions of the present application and specific configurations of these inventions will be understood from the following description.

BRIEF DESCRIPTION OF THE DRAWINGS

The above and other objects, features and advantages of the present invention will become more apparent from the following detailed description, taken in conjunction with the accompanying drawings wherein.

DETAILED DESCRIPTION OF THE PREFERRED EMBODIMENTS

Preferred embodiments of the present invention will hereinafter be described in detail with reference to the accompanying drawings.

First embodiment

Figure 1:
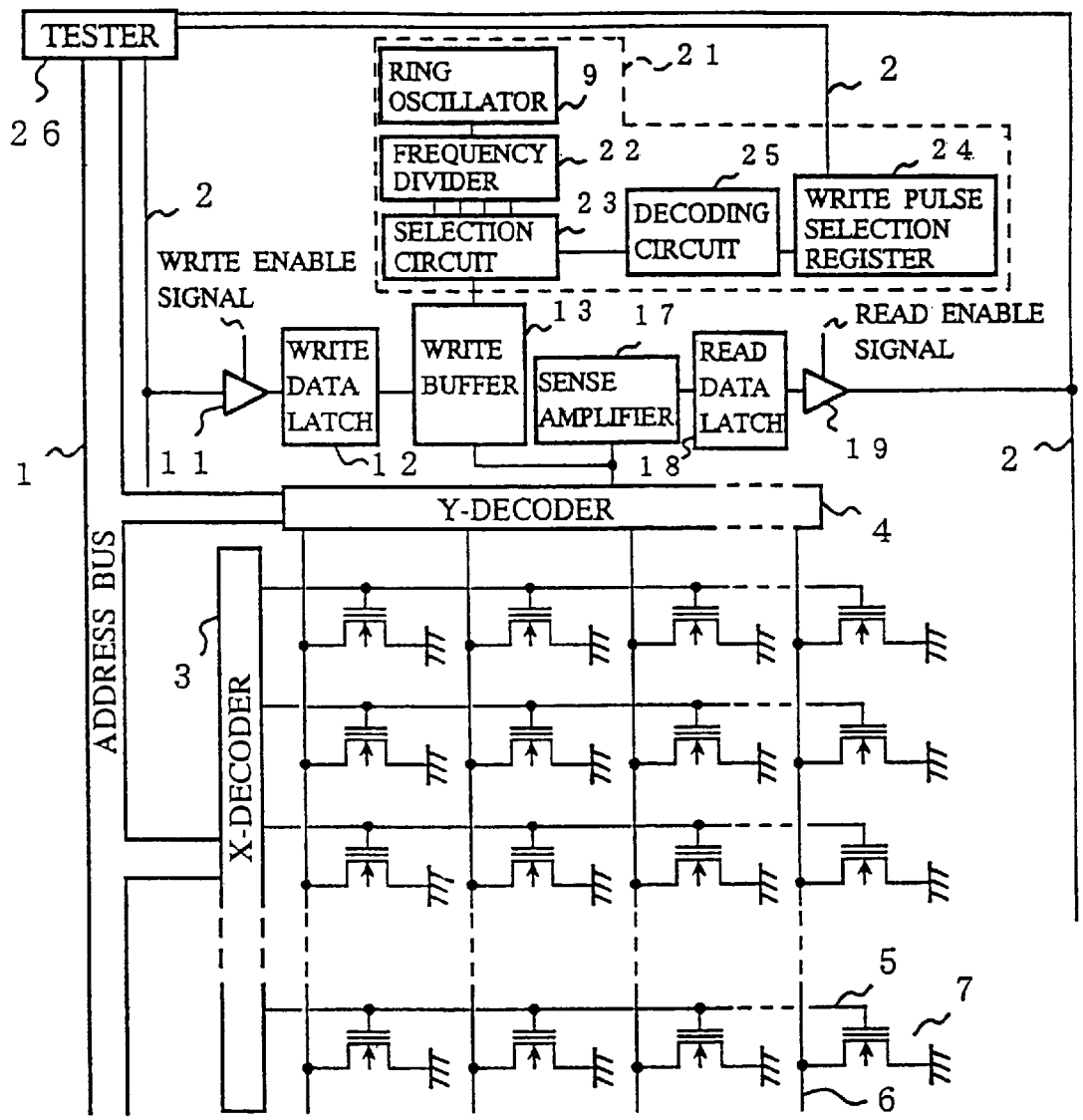
FIG. 1 is a block diagram showing a read voltage control device for a semiconductor memory device according to a first embodiment of the present invention.
Figure 2:
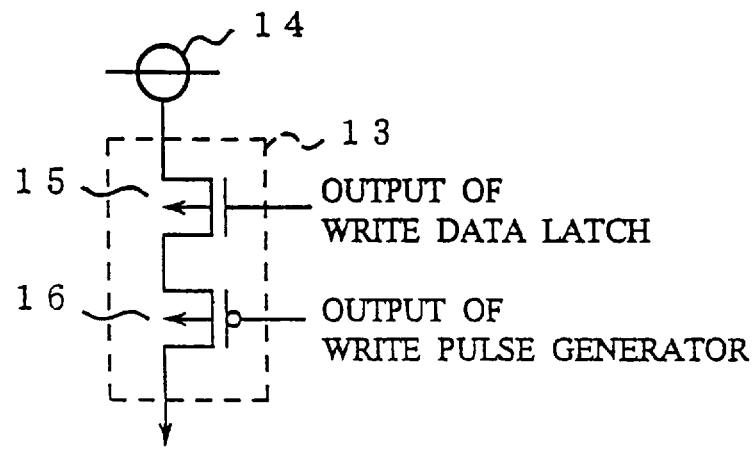
FIG. 2 is a circuit diagram illustrating the details of a write buffer.

FIG. 1 is a block diagram showing a read voltage control device for a semicoductor memory device according to a first embodiment of the present invention. There are shown in the drawing an address bus 1, a data bus 2, an X decoder 3 and a Y decoder 4 both electrically connected to the address bus 1, a plurality of word lines 5 electrically connected to the X decoder 3, a plurality of bit lines 6 electrically connected to the Y decoder 4, and a plurality of transistor memories (cells) 7 respectively electrically connected to the bit lines 6 and the word lines 5. A memory cell array is configured by electrically connecting the plurality of transistor memories to each other. Reference numeral 21 indicates a write pulse generator (write pulse generating unit) for generating a write pulse therefrom, which comprises a ring oscillator (pulse generator) 9, a frequency divider (frequency dividing unit) 22, a selection circuit (first selecting unit) 23, a write pulse selection register (first selecting unit) 24, and a decoding circuit (first selecting unit) 25. Reference numeral 11 indicates a tristate buffer electrically connected to the data bus 2, for blocking the writing of data to a write data latch 12 in response to a write enable signal. Reference numeral 12 indicates the write data latch electrically connected to the tristate buffer 11. Reference numeral 13 indicates a write buffer which comprises transistors 15 and 16 as shown in FIG. 2 and supplies a voltage pulse corresponding to the width of a pulse generated from the write pulse generator 21 from a power supply 14 to the corresponding transistor memory 7 via the Y decoder 4 and the corresponding bit line 6 in response to data outputted from the write data latch 12. Incidentally, the tristate buffer 11, the write data latch 12 and the write buffer 13 constitute a write pulse supplying unit.

Reference numeral 17 indicates a sense amplifier for reading written data when a read voltage for the corresponding transistor memory 7 rises to a threshold $V_{TH}$ exceeding a predetermined value. Reference numeral 18 indicates a read data latch electrically connected to the sense amplifier 17. Reference numeral 19 indicates a tristate buffer for blocking the supply of data latched into the read data latch 18 to the data bus 2 in response to a read enable signal. Incidentally, the sense amplifier 17, the read data latch 18 and the tristate buffer 19 constitute a read voltage determining unit.

Reference numeral 26 indicates a tester (data supplying unit) for supplying a new address signal to the X decoder 3 and the Y decoder 4 and supplying a new data signal to the tristate buffer 11 when the tester determines that the data stored in the corresponding transistor memory 7 can be read by the tristate buffer 19 through the data bus 2. Further, the tester outputs data selected from outputs produced from the frequency divider 22 to the write pulse selection register 24 upon the initial stage of its operation.

Figure 3:
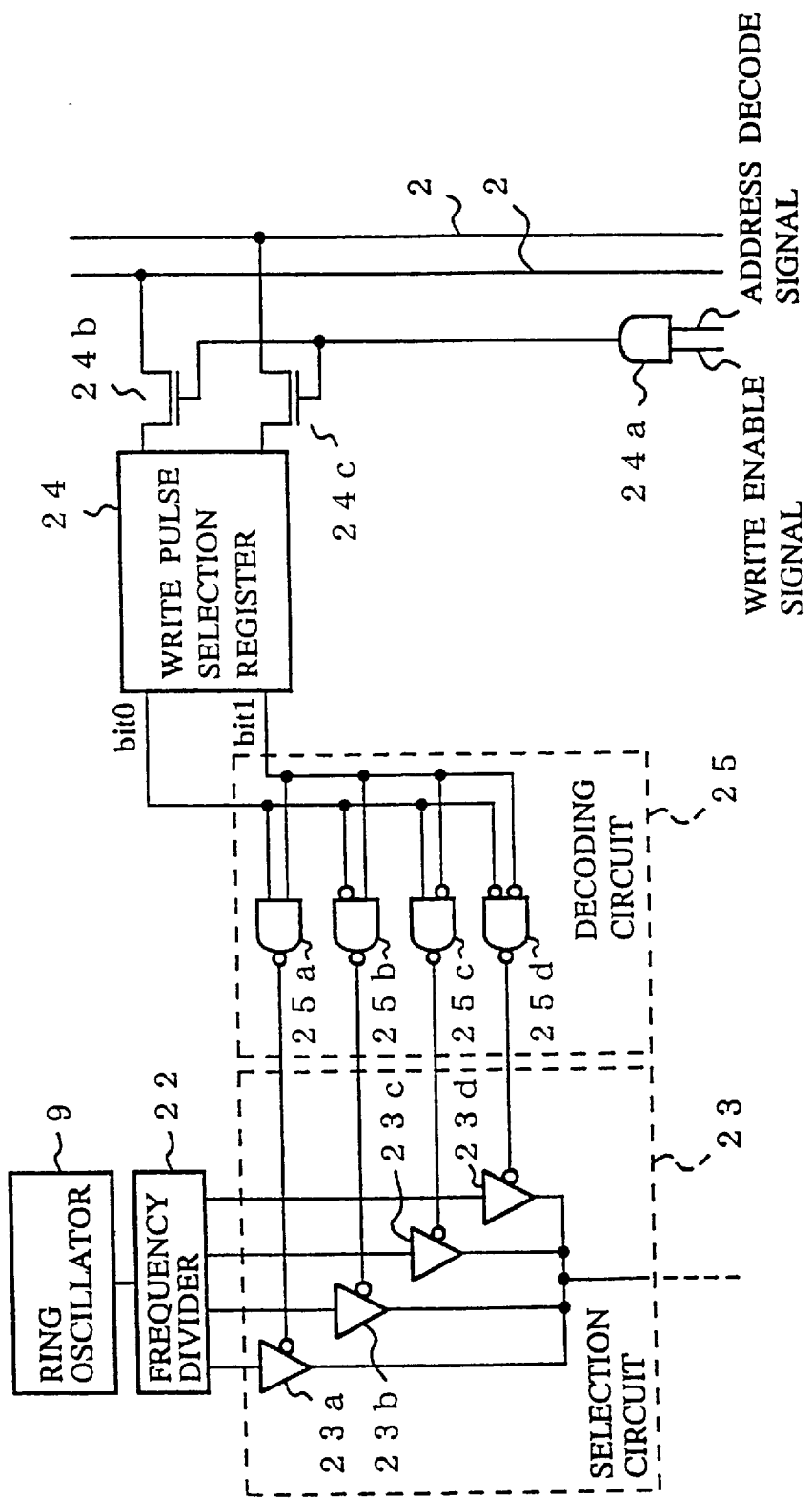
FIG. 3 is a block diagram depicting the details of a circuit configuration of a write pulse generating unit.

FIG. 3 is a block diagram showing the details of a circuit configuration of the write pulse generator 21. Reference numeral 24a indicates an AND circuit for carrying out the logical AND between the write enable signal and an address decode signal obtained by decoding an address signal. Reference numerals 24b and 24c respectively indicate transistors turned on and off according to the output of the AND circuit 24a. Reference numerals 25a through 25d respectively indicate NAND circuits that constitute the decoding circuit 25. Reference numerals 23a through 23d respectively indicate tristate buffers that constitute the selection circuit 23.

Figure 4:
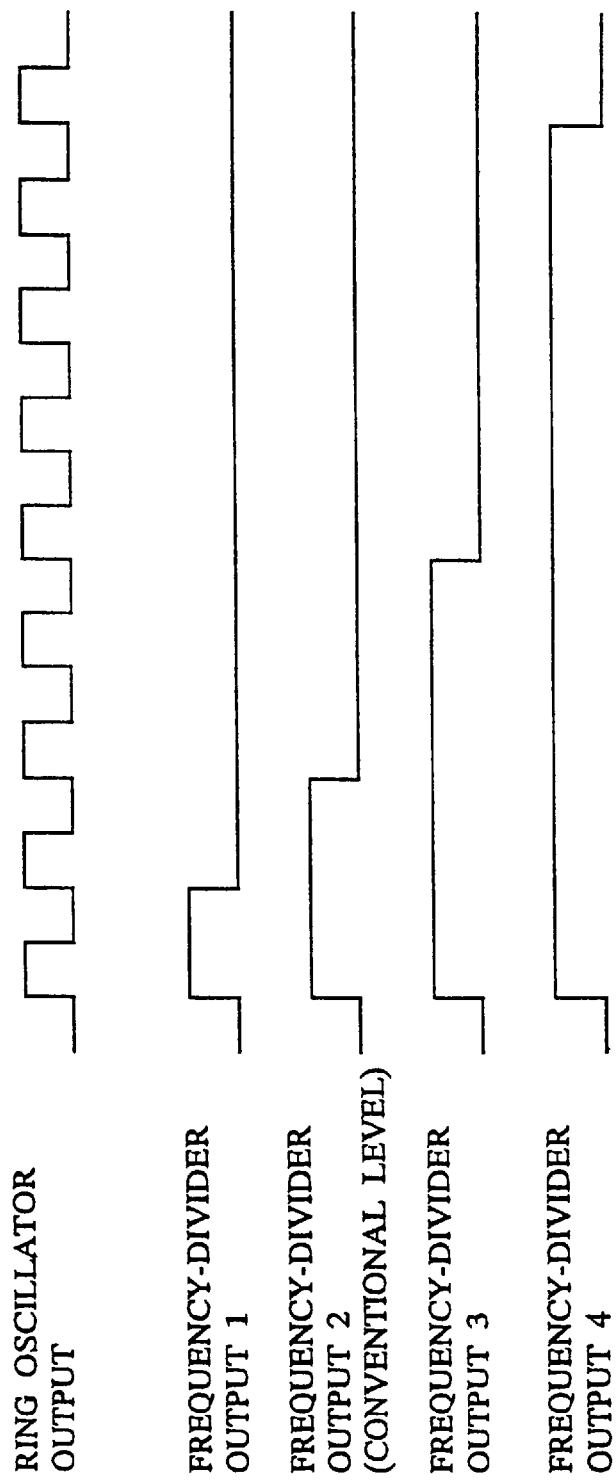
FIG. 4 is a timing chart for describing waveforms outputted from a frequency divider.

Incidentally, the frequency divider 22 is able to produce four types of frequency-divider outputs, long and short in wavelength including of a frequency-divider output 2 having a wavelength of a conventional level as shown in FIG. 4.

The operation of the present embodiment will next be described.

FIG. 1 shows a configuration of a reloadable flash EEPROM. A test Lo write data into a manufactured flash EEPROM is performed by electrically connecting the tester 26 to the address bus 1 and the data bus 2.

Figure 5:
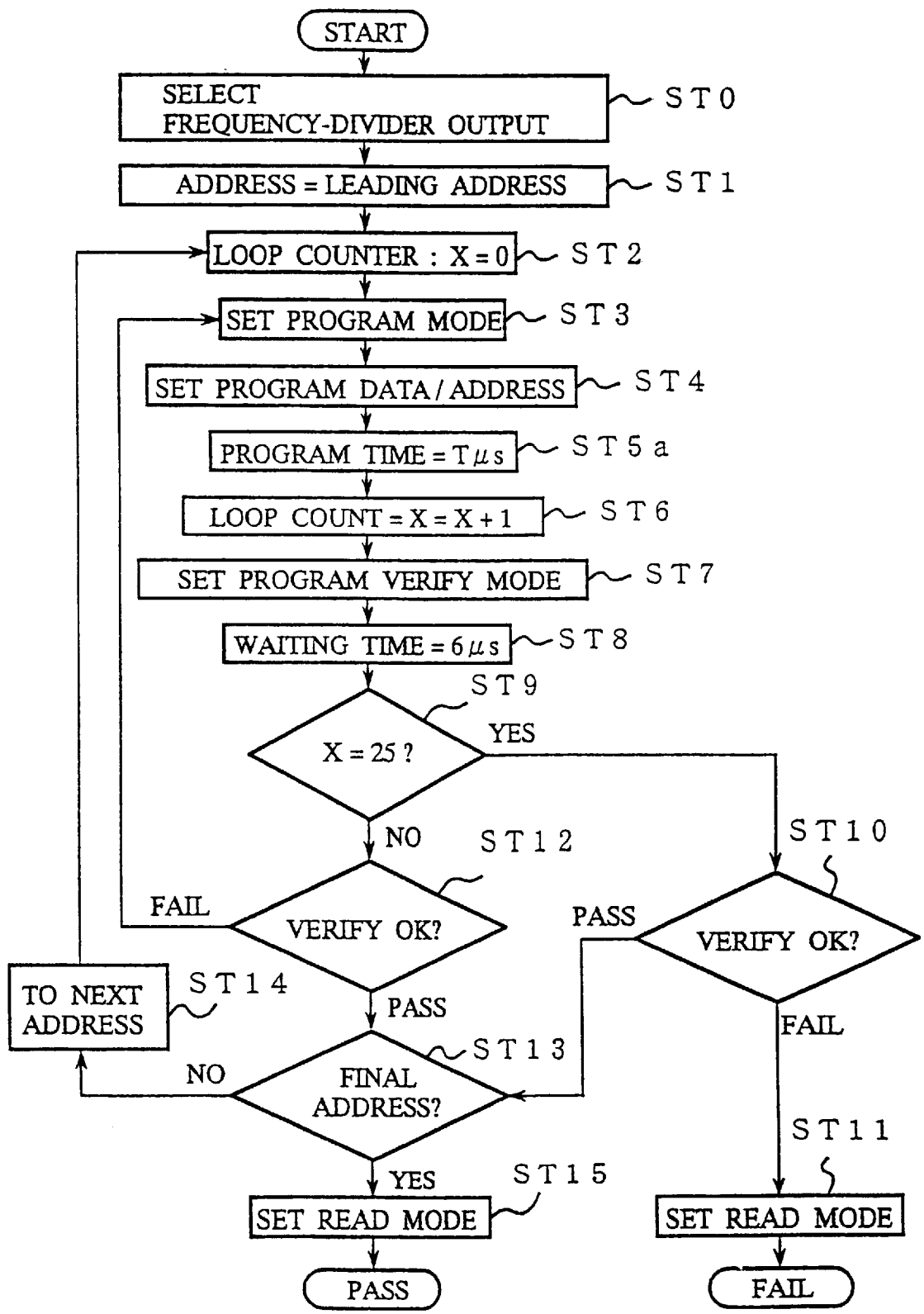
FIG. 5 is a flowchart for describing the operation of read voltage control device for a semiconductor memory device shown in FIG. 1.

FIG. 5 is a flowchart for explaining the operation of the read voltage control device for a semiconductor memory device according to the first embodiment of the present invention. The tester 26 first outputs the selection data of the outputs produced from the frequency divider 22 to the write pulse selection register 24 through the data bus 2 (Step ST0). The selection data of the outputs of the frequency divider 22 indicates an instruction for causing the selection circuit 23 to select one of the outputs produced from the frequency divider 22, which are shown in FIG. 4.

As shown in FIG. 3, the write pulse selection register 24 sets the selection data of the outputs of the frequency divider 22. The decoding circuit 25 reads the selection data of the outputs of the frequency divider 22. Further, the tristate buffers 23*a* through 23*d* of the selection circuit 23 are on- or off-controlled according to the outputs of the NAND circuits 25*a* through 25*d* of the decoding circuit 25, so that the output of the frequency divider 22, which corresponds to the selected data specified by the tester 26, is selected in Step ST5*a*.

Next, the tester 26 defines the address as a leading address (Step ST1) and initializes a loop counter X (Step ST2). Next, the tester 26 proceeds to the setting of a program mode (Step ST3) and sets program data and an address (Step ST4).

An address signal outputted from the tester 26 through the address bus 1 according to the address set in this way, is decoded by the X decoder 3 and the Y decoder 4 so that a given transistor memory 7 of the memory cell array is specified. A data signal outputted from the tester 26 through the data bus 2 according to the program data set as described above is outputted to the write buffer 13 through the tristate buffer 11 and the write data latch 12. Thereafter, the write buffer 13 allows the selection circuit 23 to select the output of the frequency divider 22 generated from the write pulse generator 21, i.e. specified by the tester 26 in Step ST0. Further, the write buffer 13 supplies a voltage pulse corresponding to the pulse width of the selected output from the power supply 14 to the above-specified transistor memory 7 through the Y decoder 4 and the corresponding bit line 6. The supply of the voltage to the transistor memory 7 at one time has heretofore been performed for 10 µs. However, this corresponds to the case where the frequency-divider output 2 shown in FIG. 4 has been selected. When the frequency-divider output I is selected, the voltage supply is carried out for T=5 µs, for example. When the frequency-divider output 3 is selected, the voltage supply is performed for T=15S, for example. Further, when the frequency-divider output 4 is selected, the voltage supply is done for T=20 µs, for example (Step ST5*a*).

Further, the tester 26 increments the loop counter X by 1 (Step ST6) and proceeds to the setting of a program verify mode (Step ST7). The program verify mode is used to read written data when the read voltage for the transistor memory 7 specified by the sense amplifier 17 has risen to the threshold $V_{TH}$ exceeding to the predetermined value and allow the tester 26 to recognize the satisfactory writing of the specified transistor memory 7 through the read data latch 18, tristate buffer 19 and data bus 2. This program verify mode is executed upon verification (Step ST12). Upon the writing of the data to the transistor memory 7, the supply of the voltage pulse to the transistor memory 7 at one time causes no attainment of the read voltage to the threshold $V_{TH}$ allowing the reading of the written data and hence the voltage pulse is always supplied plural times. Accordingly, the number of times that the voltage pulse is supplied, is set to 25 times as an upper limit (Step ST9). If the number of times that the voltage pulse is supplied, reaches 25 times and the read voltage fails to reach the threshold $V_{TH}$ (Step ST10), then the tester 26 sets a read mode and determines the product as a failed component (FAIL) (Step ST11).

If it is determined in Step ST10 that the read voltage has reached the threshold $V_{TH}$ where written data can be read, then the writing of the data to the transistor memory 7 is determined as satisfactory. If the final address is not reached at that time (Step ST13), then the tester 26 proceeds to the next address (Step ST14). If the answer is found to be NO in Step ST9, then the operations of Steps ST3 to ST12 are repeated until the read voltage reaches the threshold $V_{TH}$ where written data can be read (Step ST12). Namely, the voltage pulse is supplied to the transistor memory 7 plural times. If the processing on the final address is completed by the repetition of these operations, then the tester 26 sets the read mode and determines the product as satisfactory (Step ST15).

Although the semiconductor memory device has been described as the flash EEPROM in the first embodiment, the description will be also applicable to an EPROM.

According to the first embodiment as described above, since the wavelength of the pulse generated from the write pulse generator 21 can be arbitrarily selected by means of the designation of the tester 26, the write pulse whose wavelength is shorter than before, can be supplied to the transistor memory 7. Further, a step-like voltage width V can be reduced and variations in the read voltages between the plurality of transistor memories 7 can be lessened. Since the read voltage can be rendered more uniform than ever, it is easy to find transistor memories 7 degraded in retention property upon the execution of an acceleration test at baking or burn-in at the time of a memory test, so that the quality thereof can be improved.

If a write pulse whose wavelength is slightly long, is supplied to a transistor memory 7 hard to reach the threshold $V_{TH}$ even if the voltage pulse is supplied thereto, it is then possible to reduce the number of times that the data is written into the transistor memory 7 and shorten a determination time interval.

Further, if one of wavelengths of a plurality of pulses generated from the write pulse generator 21 is set identical to a conventional one, then a user can make use of the read voltage control device in the same manner as in the art.

Second embodiment

Figure 6:
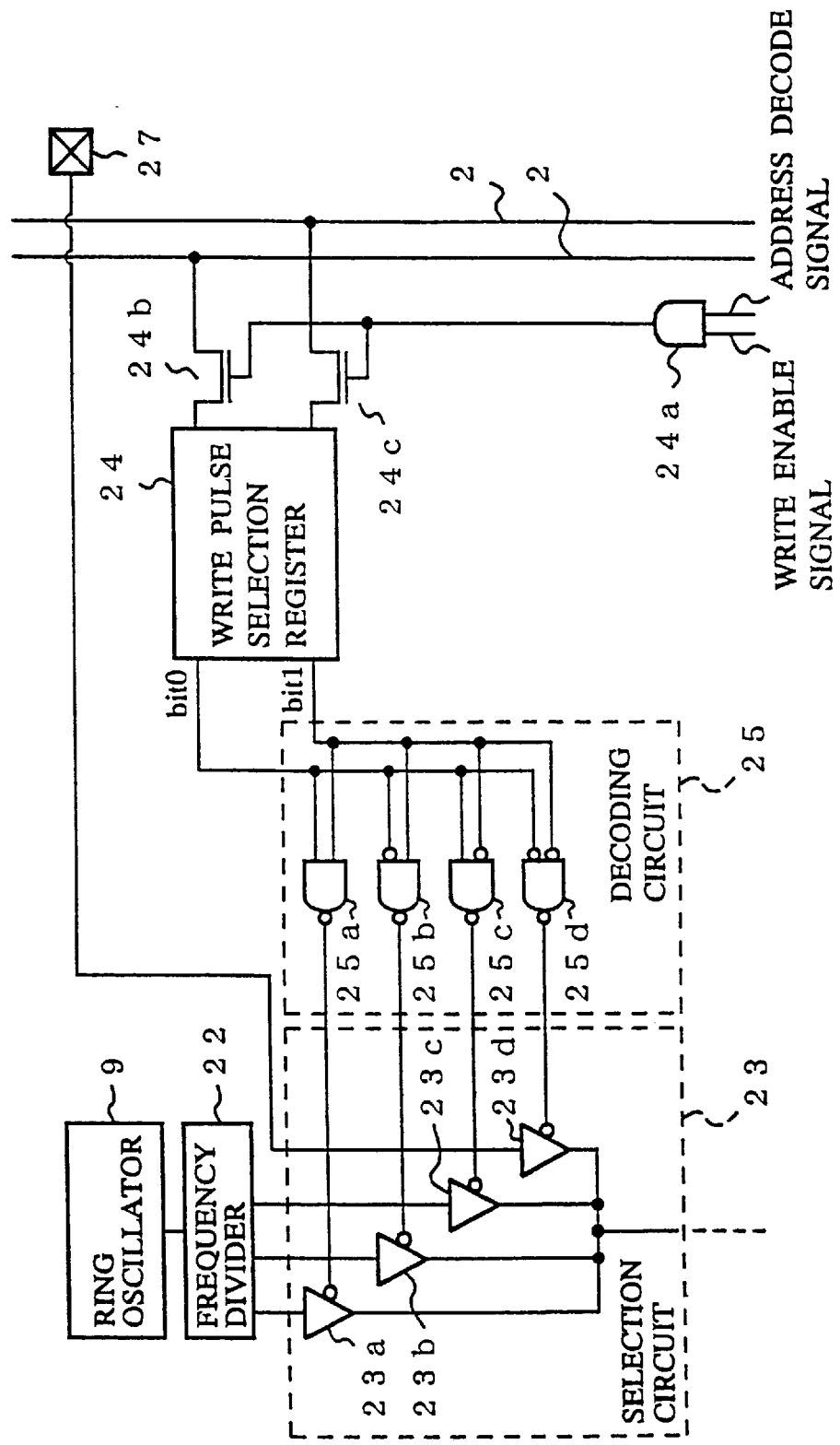
FIG. 6 is a block diagram showing the details of a circuit configuration of a write pulse generator employed in a second embodiment of the present invention.

FIG. 6 is a block diagram showing the details of a circuit configuration of a write pulse generator employed in a second embodiment of the present invention. In the same drawing, reference numeral 27 indicates an external terminal (second external terminal) electrically connected to a tristate buffer 23*d* of a selection circuit 23 and connectable to a pulse generator (variable pulse generating unit) for generating a wavelength-variable pulse.

Since the second embodiment is identical in the other configurations to the first embodiment, the description of common elements will be omitted.

The operation of the present embodiment will next be described.

Since the selection circuit 23 can be connected via the external terminal 27 to a pulse generator for generating a variable-wavelength pulse as well as a plurality of pulse wavelengths generated by a ring oscillator 9 and a frequency divider 22 in the second embodiment, a pulse wavelength supplied to each transistor memory 7 can be arbitrarily adjusted on a continual basis.

According to the second embodiment as described above, the wavelength supplied to each transistor memory 7 can be continuously arbitrarily adjusted by connecting the pulse generator for generating the variable-wavelength pulse to the external terminal 27. It is also possible to reduce variations in the read voltage between a plurality of transistor memories 7 and decrease the number of times that data is written into the corresponding transistor memory 7.

Third embodiment

Figure 7:
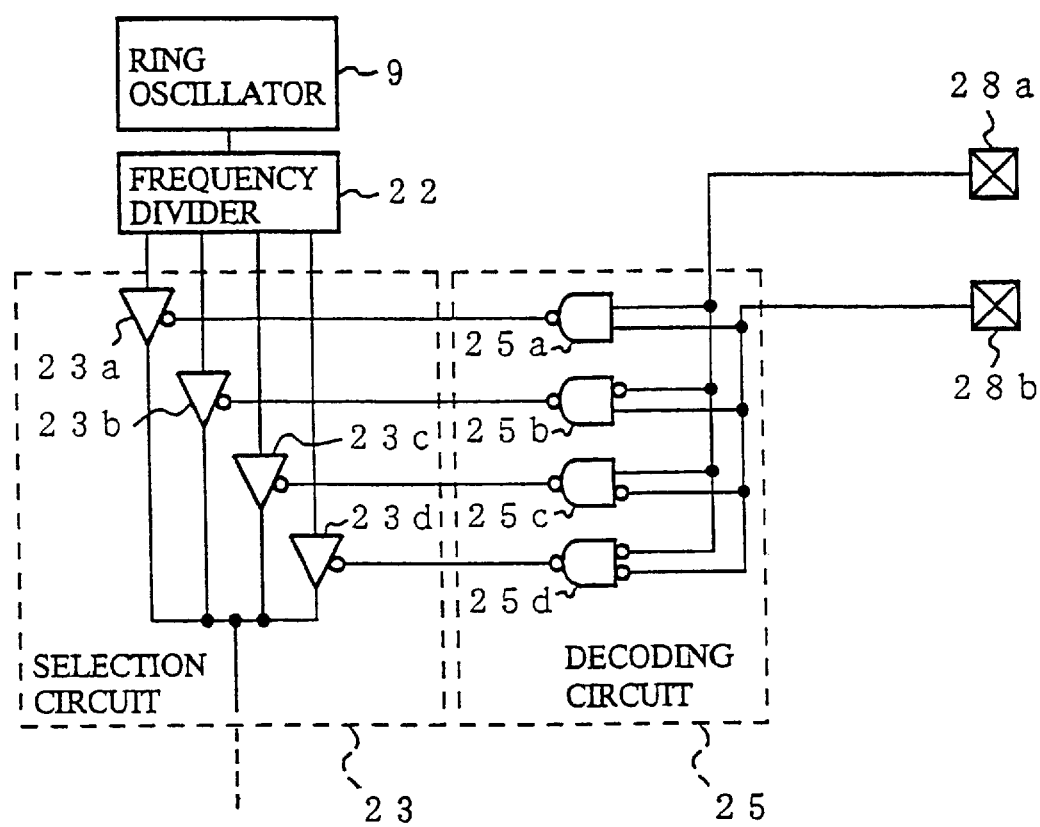
FIG. 7 is a block diagram illustrating the details of a circuit configuration of a write pulse generator employed in a third embodiment of the present invention.

FIG. 7 is a block diagram showing the details of a circuit configuration of a write pulse generator employed in a third embodiment of the present invention. In the same drawing, reference numerals 28a and 28b indicate external terminals (first external terminals). A selection circuit (second selecting unit) 23 and a decoding circuit (second selecting unit) 25 select one of a plurality of wavelengths divided by a frequency divider 22 according to data inputted through these terminals 28a and 28b.

Since the third embodiment is identical in the other configurations to the first embodiment, the description of common elements will be omitted.

The operation of the present embodiment will next be described.

In the third embodiment, for example, values of (0, 0), (0, 1), (1, 0) and (1, 1) are inputted to the external terminals 28a and 28b so as to activate NAND circuits 25a through 25d of the decoding circuit 25 in place of the specification by the tester 26. In response to their operations, tristate buffers 23a through 23d of the selection circuit 23 are controlled so as to select the corresponding output of the frequency divider 22 according to the values inputted to the external terminals 28a and 28b.

According to the third embodiment as described above, the intended output of the frequency divider 22 can be selected according to the values inputted through the external terminals 28a and 28b and hence external control can be facilitated.

Fourth embodiment

Figure 8:
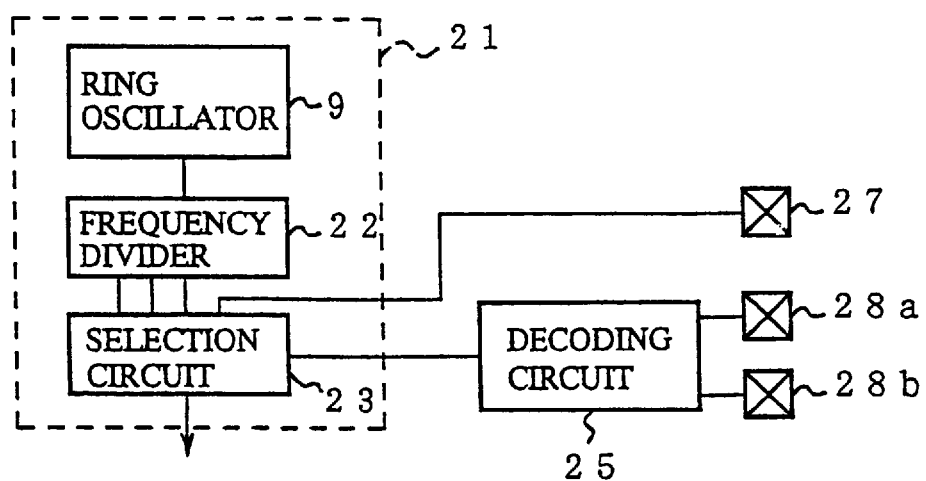
FIG. 8 is a block diagram depicting the details of a circuit configuration of a write pulse generator employed in a fourth embodiment of the present invention.

FIG. 8 is a block diagram illustrating the details of a circuit configuration around a write pulse generator employed in a fourth embodiment of the present invention. The present embodiment shows a combination of the external terminal 27 described in the second embodiment and the external terminals 28a and 28b described in the third embodiment.

Since the fourth embodiment is identical in the other configurations to the first embodiment, the description of common elements will be omitted.

According to the fourth embodiment as described above, the wavelength supplied to each transistor memory 7 can be arbitrarily adjusted on a continual basis by connecting a pulse generator for generating a variable-wavelength pulse to the external terminal 27. Further, an intended output of a frequency divider 22 can be selected by inputting values to the external terminals 28a and 28b, so that external control can be facilitated.

Fifth embodiment

Figure 9:
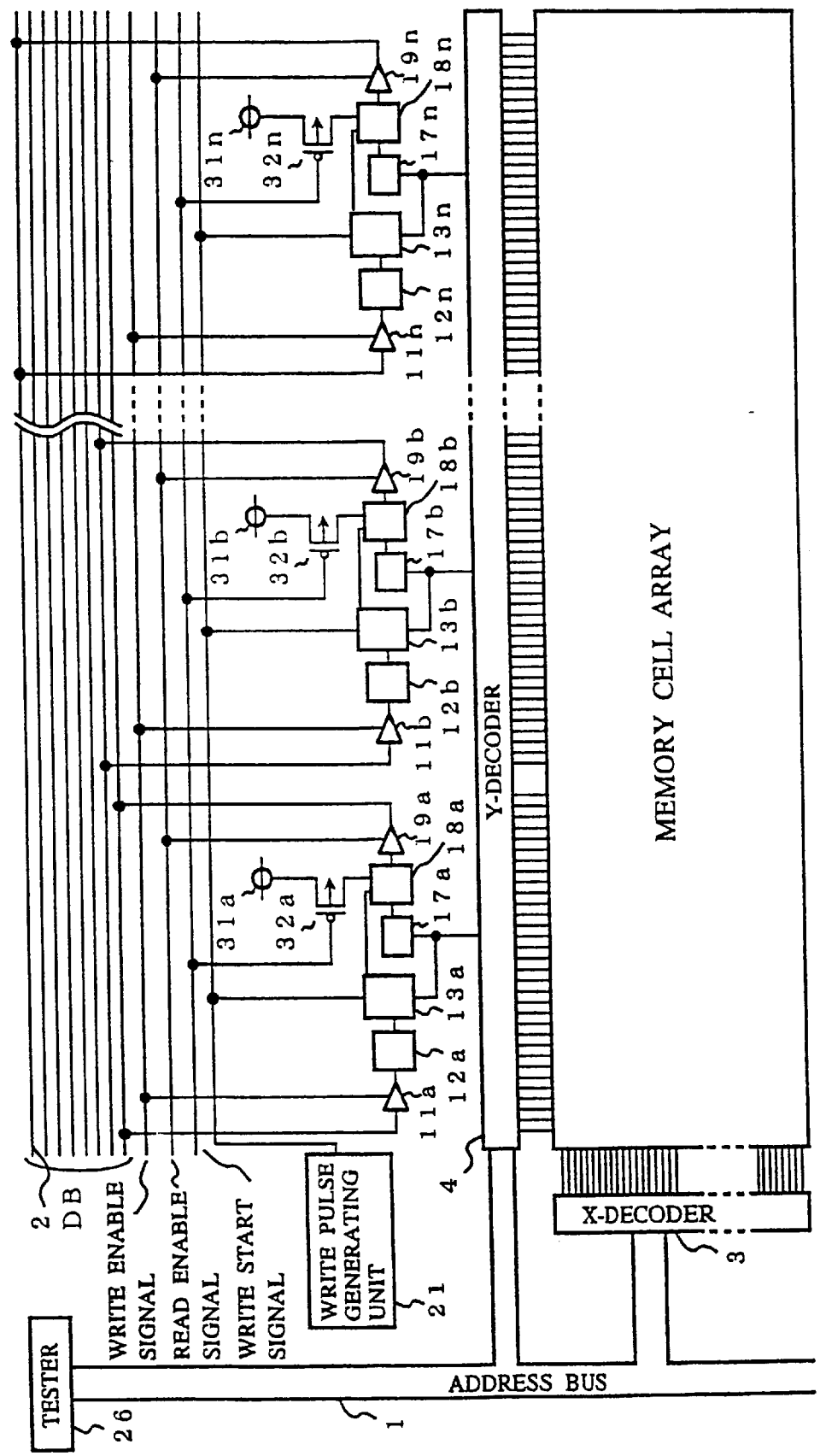
FIG. 9 is a block diagram showing a read voltage control device for a semiconductor memory device according to a fifth embodiment of the present invention.
Figure 10:
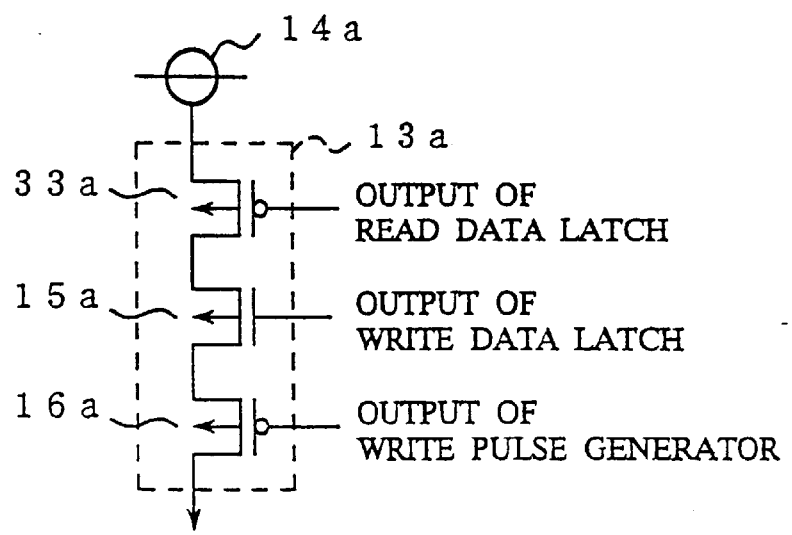
FIG. 10 is a circuit diagram illustrating the details of a write buffer.

FIG. 9 is a block diagram showing a read voltage control device for a semiconductor memory device according to a fifth embodiment of the present invention. FIG. 9 shows an n-bit counterpart of the block diagram shown in FIG. 1. In the drawing, reference numerals 11a through 11n indicate tristate buffers respectively. Reference numerals 12a through 12n indicate write data latches respectively. Reference numerals 13a through 13n indicate write buffers which comprise transistors 15a through 15n, 16a through 16n and 33a through 33n, respectively as shown in FIG. 10. Incidentally, the tristate buffers 11a through 11n, write data latches 12a through 12n and write buffers 13a through 13n constitute write pulse supplying units respectively.

Figure 11:
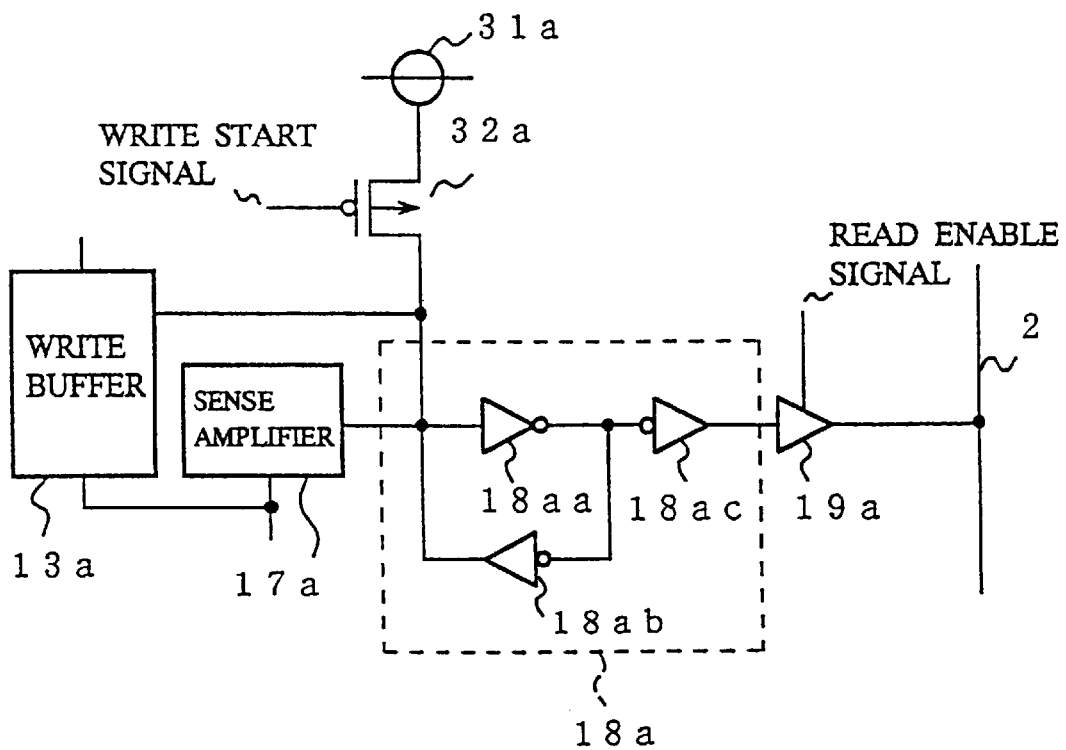
FIG. 11 is a block diagram depicting the details of a circuit configuration of a read data latch.

Reference numerals 17a through 17n indicate sense amplifiers respectively. Reference numerals 18a through 18n indicate read data latches composed of buffers 18aa through 18na, 18ab through 18nb and 18ac through 18nc, respectively as shown in FIG. 11. Reference numerals 19a through 19n indicate tristate buffers respectively. Incidentally, the sense amplifiers 17a through 17n, read data latches 18a through 18n and tristate buffers 19a through 19n constitute read voltage determining units respectively. Reference numerals 31a through 31n indicate power supplies respectively. Reference numerals 32a through 32n respectively indicate transistors which are turned on in response to a write start signal outputted from a tester 26 and initialize the read data latches 18a through 18n in response to the write start signal. The power supplies 31a through 31n and the transistors 32a through 32n constitute decision initializing circuits respectively.

Reference numeral 21 indicates a write pulse generator (write pulse generating unit).

Since the fifth embodiment is identical in the other configurations to the first embodiment, the description of common elements will be omitted.

The operation of the fifth embodiment will next be described.

The fifth embodiment shows the n-bit counterpart and is characterized by providing the transistors 32a through 32n turned off in response to read data latch outputs produced from the read data latches 18a through 18n within the write buffers 13a through 13n respectively.

If write pulses are supplied from the write buffers 13a through 13n to their corresponding transistor memories 7a through 7n respectively so that written data can be read therefrom by the sense amplifiers 17a through 17n respectively in a manner similar to the first embodiment, then "0" is latched into the corresponding read data latches 18a through 18n. Since "0" is outputted as the read data latch outputs for the corresponding transistors 32a through 32n according to the latching of "0" into the read data latches 18a through 18n, respectively, the corresponding transistors 32a through 32n are turned off so that the supply of the write pulses from the corresponding write buffers 13a through 13n to the transistor memories 7a through 7n is stopped.

Figure 17:
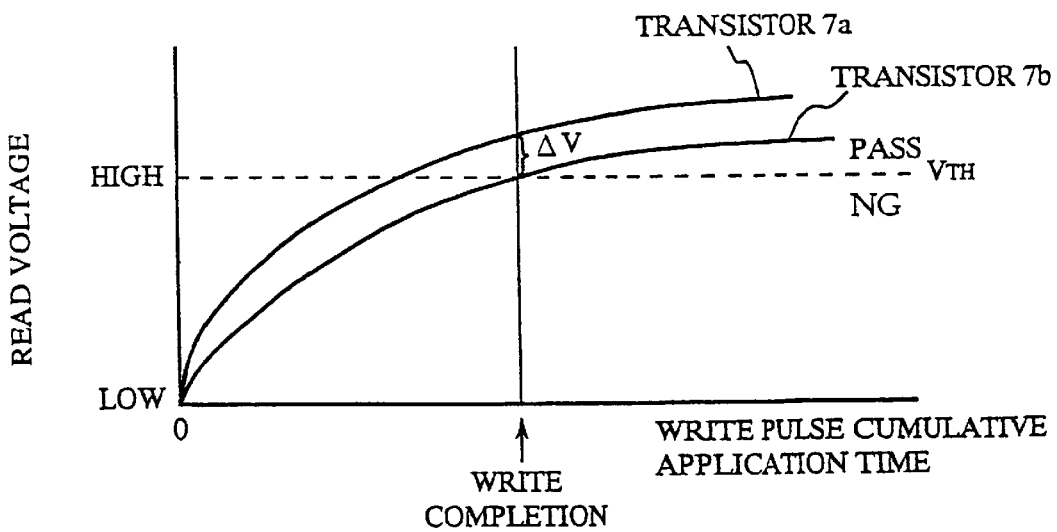
FIG. 17 is a characteristic diagram of a plurality of conventional transistors, which represents the differences in rise between mutual read voltages.

Accordingly, the transistor memories 7a and 7b mutually cause the difference V between the read voltages due to variations in manufacture in the prior art as shown in FIG. 17 by way of example. In the fifth embodiment, however, the difference V between the read voltages due to the variations in manufacture can be reduced because if the written data can be read by the sense amplifiers 17a through 17n respectively, then supply of the write pulses to the transistor memories 7a through 7n placed in states of capable of being read by the sense amplifiers 17a through 17n is stopped.

Since variations in the read voltage subsequent to all-regions writing made before the erasing of memories, which is required to prevent overerasing during memory erasing, is reduced particularly when the present invention is applied to a flash EEPROM, variations in the read voltage after the erasing of the memories can be also reduced.

Figure 12:
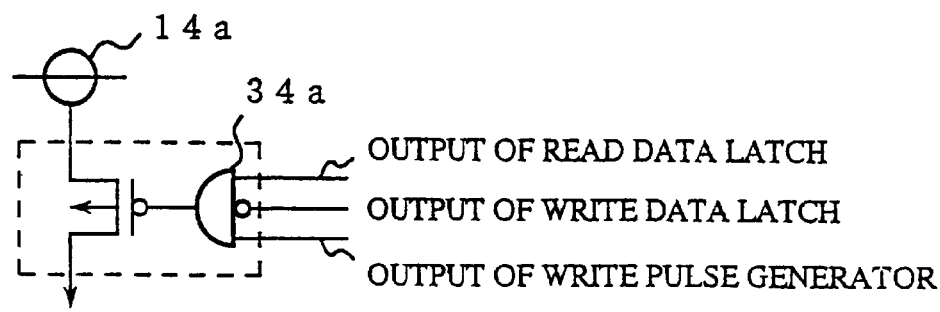
FIG. 12 is a circuit diagram showing the details of another example of the write buffer.

Although the write buffers 13a through 13n are configured as shown in FIG. 10, the same effect as described above can be obtained even if an AND circuit 34a is provided as shown in FIG. 12 in place of the write buffers 13a through 13n and is supplied with the read data latch outputs, the write data latch outputs and the output of the write pulse generator.

The fifth embodiment is characterized by providing the power supplies 31a through 31n and transistors 32a through 32n turned on in response to the write start signal outputted from the tester 26 as shown in FIG. 11. The read data latches 18a through 18n can be initialized based on the write start signal outputted from the tester 26.

Namely, if the write pulses are supplied from the write buffers 13a through 13n to their corresponding transistor memories 7a through 7n respectively and the written data can be read by the sense amplifiers 17a through 17n respectively, then "0" is latched into the corresponding read data latches 18a through 18n so that the supply of the write pulses from the corresponding write buffers 13a through 13n to the transistor memories 7a through 7n is stopped. The tester 26 starts writing at the next address when the supply of the write pulses to all the transistor memories 7a through 7n is stopped.

Now, the tester 26 supplies the write start signal to the transistors 32a through 32n as "1" to turn on the transistors 32a through 32n. Further, the power supplies 31a through 31n supply voltages to the read data latches 18a through 18n respectively so that the read data latches 18a through 18n are initially set from "0" to "1".

If such a configuration is not adopted, then a read data latch 18 remains "0" even if a shift to the supply of a write pulse to a transistor memory 7 corresponding to a new address is made. Therefore, a first write pulse is not supplied to the transistor memory 7 corresponding to the new address and a sense amplifier 17 determining that the read voltage of the transistor memory 7 has risen Lo a threshold $V_{TH}$ exceeding a predetermined value, causes the read data latch 18 to hold "1" therein. Thus, since a second write pulse is supplied to the transistor memory 7, a time loss is suffered by the time required to supply the write pulse once. However, the fifth embodiment can prevent the occurrence of its time loss.

According to the fifth embodiment as described above, a further advantageous effect can be brought about in addition to the effect obtained by the first embodiment in that if the written data can be read by the sense amplifiers 17a through 17n, the supply of the write pulses to the transistor memories 7a through 7n brought into the readable states is stopped in order from the transistor memories 7a through 7n, thereby making it possible to reduce the difference V between the read voltages due to the variations in manufacture.

Since the read data latches 18a through 18n can be initialized by the write start signal outputted from the tester 26, it is possible to prevent a time loss developed upon writing of data to the transistor memory 7 corresponding to the new address.

Sixth embodiment

Figure 13:
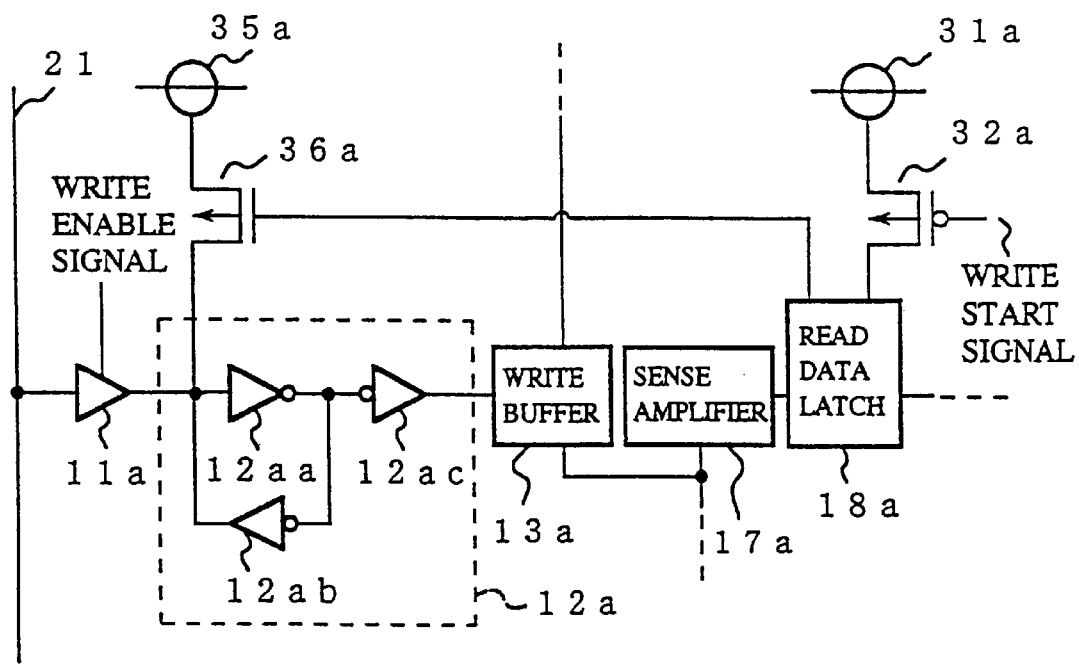
FIG. 13 is a block diagram illustrating the details of a circuit configuration of a write data latch employed in a sixth embodiment of the present invention.
Figure 14:
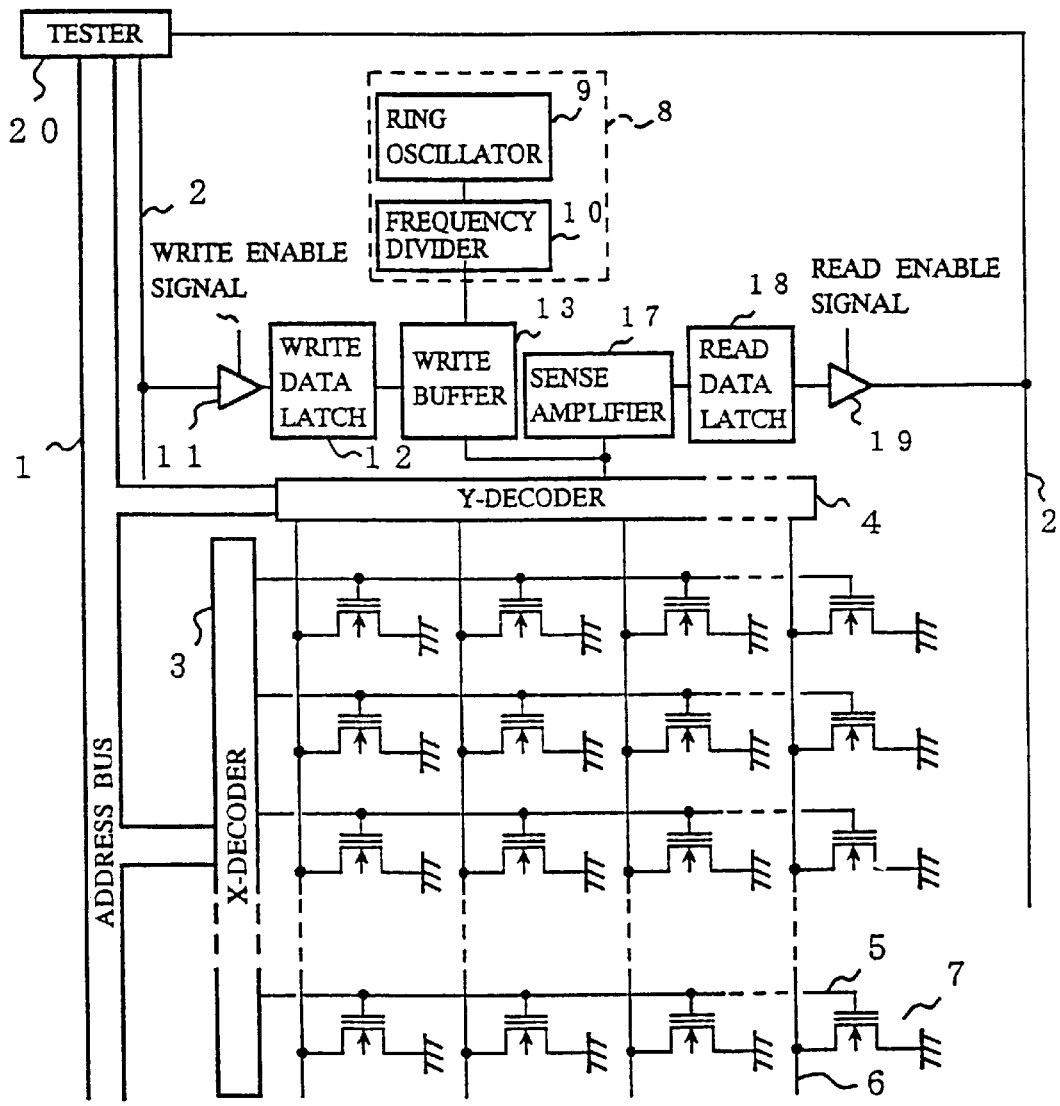
FIG. 14 is a block diagram showing a conventional read voltage control device for a semiconductor memory device.
Figure 15:
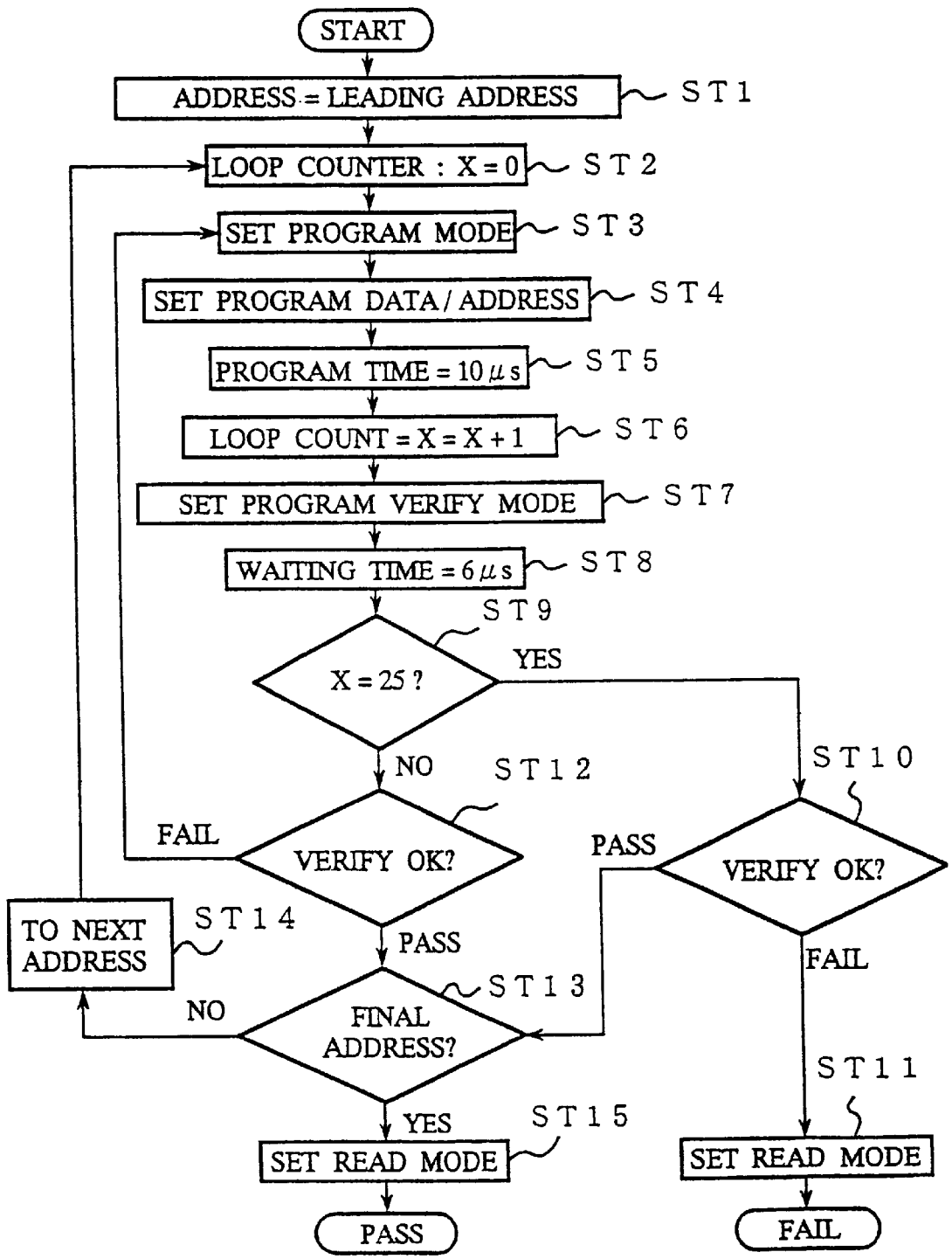
FIG. 15 is a flowchart for describing the operation of the read voltage control device shown in FIG. 14.
Figure 16:
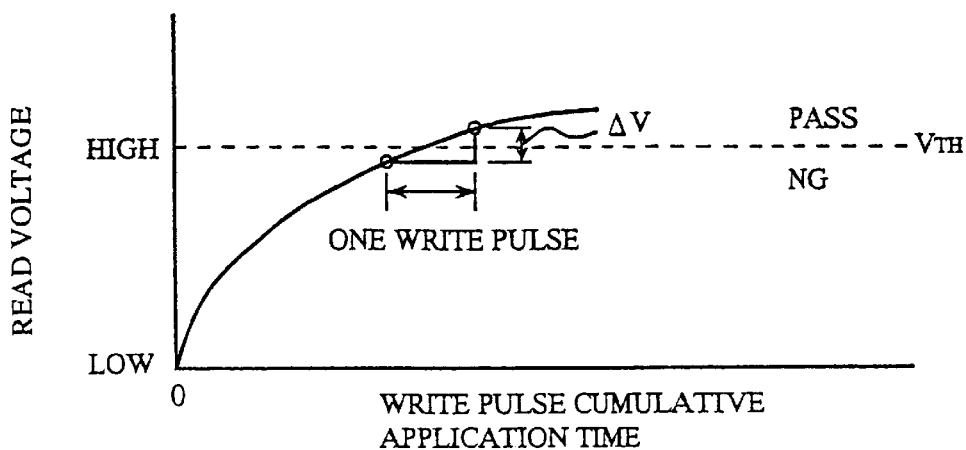
FIG. 16 is a characteristic diagram illustrating a rise in the read voltage of a conventional transistor.

FIG. 13 is a block diagram showing a read voltage control device for a semiconductor memory device according to a sixth embodiment of the present invention. In the drawing, reference numeral 12a indicates a write data latch composed of buffers 12aa, 12ab and 12ac. Designated at numeral 35a is a power supply. Reference numeral 36a indicates a transistor turned on when "0" is outputted from a read data latch 18a as a read data latch output.

FIG. 13 typically shows an a-system configuration. Other b to n system configurations are similar to the a-system configuration.

The configuration of the write buffer 13a corresponds to that shown in FIG. 10 or 12 in the fifth embodiment, whereas the write buffer 13a is configured as shown in FIG. 2 in the sixth embodiment.

The operation of the sixth embodiment will next be described.

If write pulses are supplied from the write buffers 13a through 13n to their corresponding transistor memories 7a through 7n respectively so that written data can be read by the sense amplifiers 17a through 17n respectively in a manner similar to the fifth embodiment, then "0" is latched into the corresponding read data latches 18a through 18n. Since "0" is outputted as the read data latch outputs for the corresponding transistors 36a through 36n according to the latching of "0" into the read data latches 18a through 18n, respectively, the corresponding transistors 36a through 36n are turned on so that the corresponding power supplies 35a through 35n supply the voltages to their corresponding write data latches 12a through 12n. Therefore, "1" is latched in the write data latches 12a through 12n so that the write data latches 12a through 12n stops the supply of outputs to the corresponding write buffers 13a through 13n.

Accordingly, the same effect as that obtained by the fifth embodiment can be brought about.

According to the sixth embodiment as described above, if the written data can be read by the sense amplifiers 17a through 17n, the supply of the write pulses to the transistor memories 7a through 7n is stopped in order from the transistor memories 7a through 7n. It is therefore possible to reduce the difference V between the read voltages due to variations in manufacture.

While the present invention has been described with reference to the preferred embodiments, the description of these is made by way of illustrative example. It will be apparent to those skilled in the art on reference to these description that various modifications and changes can be made without departing from the spirit or scope of the invention as set forth therein.

What is claimed is:

1. A read voltage control device for a nonvolatile semiconductor memory device comprising:

a nonvolatile memory cell array including a plurality of cells;

an X decoder and a Y decoder electrically connected to said plurality of cells;

a write pulse generating unit for generating a first write pulse signal having a variable wavelength;

a write pulse supplying unit for receiving the first write pulse signal and for supplying a second write pulse signal having a variable wavelength to a cell of said nonvolatile memory cell array to place said cell in a readable state, said cell being specified by said X decoder and said Y decoder according to an address signal;

a read voltage determining unit for determining whether a read voltage of said cell exceeds a threshold value for placing said cell in the readable state; and a data supplying unit for supplying a new address signal to said X decoder and said Y decoder and supplying a new data signal to said write pulse supplying unit when said read voltage determining unit determines that the read voltage of said cell exceeds the threshold value for placing said cell in the readable state.

2. The read voltage control device for a semiconductor memory device according to claim 1, comprising a decision initializing circuit for initializing a determination of the read voltage determining unit after said data supplying unit indicates that the read voltage determining unit has determined that the read voltage of said cell exceeds the threshold value for placing said cell in a readable state and for preventing supply of the second write pulse signal to said cell.

3. The read voltage control device for a semiconductor memory device according to claim 1, wherein said write pulse generating unit comprises:
   a pulse generator for generating a first signal having a first wavelength;
   a frequency divider for frequency-dividing the first signal generated by said pulse generator into a plurality of second signals having a plurality of wavelengths different from the first wavelength; and
   a selecting unit for selecting one of the plurality of second signals as the first write pulse signal according to data produced by said data supplying unit.

4. The read voltage control device for a semiconductor memory device according to claim 3, wherein said write pulse generating unit further comprises:
   a first external terminal for inputting data, wherein said selecting unit selects one of the plurality of second signals according to the data inputted from said first external terminal and the data produced by said data supplying unit.

5. A read voltage control device for a nonvolatile semiconductor memory device comprising:
   a nonvolatile memory cell array including a plurality of cells;
   an X decoder and a Y decoder electrically connected to said plurality of cells;
   a write pulse generating unit for generating a plurality of first write pulse signals, each of the first write pulse signals having a variable wavelength;
   a plurality of write pulse supplying units for receiving the first write pulse signals and for supplying a plurality of second write signals having variable wavelengths to a plurality of cells of said nonvolatile memory cell array to place said cells in a readable state, said cells being specified by said X decoder and said Y decoder according to address signals;
   a plurality of read voltage determining units for stopping the supply of one of the second write pulse signals to one of said cells from a corresponding write pulse supplying unit of said plurality of write pulse supplying units when a read voltage of said cell is determined to exceed a threshold value for placing said cell in the readable state; and
   a data supplying unit for supplying a new address signal to said X decoder and said Y decoder and supplying a new data signal to each of said plurality of write pulse supplying units when said plurality of read voltage determining units determine that read voltages of said plurality of cells exceed a threshold value for placing said cells in readable states.

6. The read voltage control device for a semiconductor memory device according to claim 5, further comprising a decision initializing circuit for initializing results of determination by all of said read voltage determining units after said data supplying unit has recognized that all of said read voltage determining units have determined that the read voltages of said cells exceed the threshold value for placing said cells in readable states, respectively.

7. The read voltage control device for a semiconductor memory device according to claim 5, wherein each of said write pulse generating units comprises:
   a pulse generator for generating a first signal having a first wavelength;
   a frequency divider for frequency-dividing the first signal generated by said pulse generator into a plurality of second signals having a plurality of wavelengths different from the first wavelength; and
   a selecting unit for selecting one of the plurality of second signals according to data produced by said data supplying unit.

8. The read voltage control device for a semiconductor memory device according to claim 7, wherein each of said write pulse generating units further comprises:
   a first external terminal for inputting data, wherein said selecting unit selects one of the plurality of second signals as the first write pulse signal according to the data inputted from said first external terminal and the data produced by said data supplying unit.

9. The read voltage control device according to claim 1 wherein said data supplying unit comprises a test unit coupled to said write pulse generating unit for selecting the variable wavelength of the first write pulse signal.

10. The read voltage control device according to claim 5 wherein each of said plurality of write pulse supplying units comprises a test unit coupled to one of said write pulse generating units for selecting the wavelength of one of the write pulse signals.

11. The read voltage control device according to claim 3 wherein said selecting unit comprises:
   a write pulse selection register for storing bits for selecting the wavelength of the first write pulse signal;
   a decoding circuit coupled to said write pulse selection register for logically combining the bits to produce a plurality of selection signals; and
   a selection circuit coupled to said decoding circuit and said frequency divider for selecting one of the second signals as the first write pulse signal based on the selection signals.

12. The read voltage control device according to claim 11 wherein said data supplying unit comprises a test unit coupled to said write pulse selection register for writing the bits to the write pulse selection register, thereby selecting the wavelength of the first write pulse signal.

13. The read voltage control device according to claim 7 wherein said selecting unit comprises:
   a write pulse selection register for storing bits for selecting the wavelength of the first write pulse signal;
   a decoding circuit coupled to said write pulse selection register for logically combining the bits to produce a plurality of selection signals;
   a selection circuit coupled to said decoding circuit and said frequency divider for selecting one of the second signals as the first write pulse signal based on the selection signals.

14. The read voltage control device according to claim 13 wherein each of said data supplying units comprises a test unit coupled to said write pulse selection register for writing the bits to the register and thereby selecting the wavelength of the first write pulse signal.

15. The read voltage control device for a semiconductor memory device according to claim 4, wherein said write pulse generating unit further comprises:

a second external terminal connected to a variable pulse generating unit for generating a variable wavelength pulse, the first write pulse signal being selected by said selecting unit from the plurality of second signals and the variable wavelength pulse.

16. The read voltage control device for a semiconductor memory device according to claim 3, wherein said write pulse generating unit comprises:

an external terminal connected to a variable pulse generating unit for generating a variable wavelength pulse, the first write pulse signal being selected by said selecting unit from the plurality of second signals and the variable wavelength pulse.

17. The read voltage control device for a semiconductor memory device according to claim 8, wherein said write pulse generating unit further comprises:

a second external terminal connected to a variable pulse generating unit for generating a variable wavelength pulse, the first write pulse signal being selected by said selecting unit from the plurality of second signals and the variable wavelength pulse.

18. The read voltage control device for a semiconductor memory device according to claim 3, wherein said write pulse generating unit comprises:

an external terminal connected to a variable pulse generating unit for generating a variable wavelength pulse, the first write pulse signal being selected by said selecting unit from the plurality of second signals and the variable wavelength pulse.

* * * * *